(12) United States Patent
Meagley et al.

(10) Patent No.: US 7,615,337 B2
(45) Date of Patent: Nov. 10, 2009

(54) PHOTOACTIVE RESIST CAPPING LAYER

(75) Inventors: Robert P. Meagley, Hillsboro, OR (US); Michael McSwiney, Hillsboro, OR (US); Michael D. Goodner, Hillsboro, OR (US); Robert Leet, Scottsdale, AZ (US); Manish Chandhok, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 777 days.

(21) Appl. No.: 10/927,885

(22) Filed: Aug. 27, 2004

(65) Prior Publication Data

US 2006/0046206 A1    Mar. 2, 2006

(51) Int. Cl.
*G03F 1/00* (2006.01)

(52) U.S. Cl. .................. 430/322; 430/325; 430/328

(58) Field of Classification Search ............ 430/328, 430/322
See application file for complete search history.

(56) References Cited

U.S. PATENT DOCUMENTS

| | | | |
|---|---|---|---|
| 4,615,782 A * | 10/1986 | Namatsu et al. | 204/192.36 |
| 6,197,687 B1 * | 3/2001 | Buynoski | 438/671 |
| 6,566,280 B1 | 5/2003 | Meagley et al. | 438/780 |
| 6,667,210 B2 * | 12/2003 | Schneider et al. | 438/257 |
| 2001/0003030 A1 * | 6/2001 | Jung et al. | 430/273.1 |

* cited by examiner

*Primary Examiner*—Thori Chea
(74) *Attorney, Agent, or Firm*—Trop, Pruner & Hu, P.C.

(57) ABSTRACT

A cap may be formed anisotropically over a photoresist feature. For example, a material, such as a polymer, may be coated over the photoresist feature. If the coated material is photoactive, the cap may be grown preferentially in the vertical direction, creating high aspect ratio structures in some embodiments of the present invention.

12 Claims, 2 Drawing Sheets

PHOTOACTIVE RESIST CAPPING LAYER

BACKGROUND

This invention relates generally to photolithographic processes for manufacturing semiconductors.

In photolithographic processes, a radiation pattern from a mask is transferred to a photoresist. The exposed portions of the photoresist are either made more or less soluble. The more soluble material is then removed to transfer the pattern from a mask to the pattern of photoresist on a substrate. The photoresist pattern may then be utilized as an etch mask to etch a corresponding pattern into the semiconductor substrate.

It is known that a polymer and, more particularly, an acid catalyzed cross-linking material may be utilized to form an etch resistant cap or shell over a photoresist line. The material may be a resolution enhancement lithography assisted by chemical shrink (RELACS) polymer. In the RELACS process, a photolithographically defined resist pattern may be enhanced or thickened using a RELACS overcoating. The RELACS overcoating grows isotropically. That is, it grows equally on the top and sides of the photoresist line. This horizontal growth, in effect, increases the size of the resulting transferred pattern, allowing feature sizes to be adjusted after patterning the rest (such as reducing the size of a hole, patterning in a photoresist, when the patterning process is not sensitive enough to produce holes as small as the desired size).

On the other hand, the RELACS overcoating may be useful in improving the quality of the overall resist line. For example, some resists may be tailored to make it easy to define their shape, but they may be poor at transferring that shape to a substrate. The cap or shell provided by the RELACS process may add this latter property of enabling the transfer of the pattern to the substrate. Because the RELACS shell or cap is self-aligned with the underlying resist, relatively thin resist patterns can be augmented.

Another application for RELACS is where a resist pattern may be poorly resolved. For example, a straight line portion of resist may be subject to having breaks through it. A conformal coating, such as RELACS, may fill in these gaps and make the pattern more accurate.

Finally, current lithography may use smaller resist thicknesses. There are several reasons for this. One reason is that the ability to pattern thin resists may be better. In 193 or 157 nanometer photolithography, less robust photoresists may be utilized that do not stand up well to ensuing plasma etching. In extreme ultraviolet lithography, very thin films must be used because of the problem of absorption of the extreme ultraviolet radiation or due to the collapse behavior of the resist features. In order to render the features more resistant to the pattern transfer process (i.e. to confer greater etch resistance to them), a conformal coating, such as RELACS, may serve to improve the overall etch resistance of the features. As the size of the resist features decrease with each succeeding generation of manufacture, the roughness of the features forming the photoresist pattern becomes more important to control as it become a larger percentage of the total size of the feature. This phenomenon gives rise to so-called line edge or line width roughness. Thus, a conformal coating, such as RELACS, may improve the overall roughness of the features.

For all of these reasons, the RELACS process may be highly desirable. However, it would be equally desirable to have a RELACS type process that does not unnecessarily widen the capped photoresist features.

Thus, there is a need for better ways to anisotropically cap photoresist features in semiconductor manufacturing processes.

DETAILED DESCRIPTION

Figure 1:
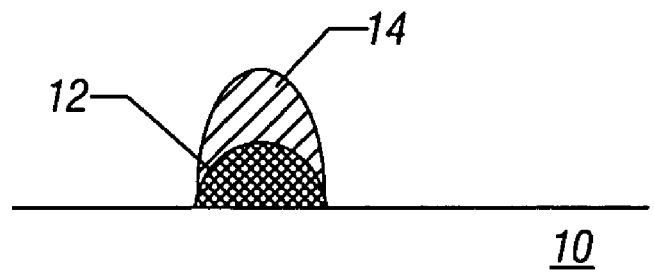
FIG. 1 is an enlarged, cross-sectional view of a capped photoresist line in accordance with one embodiment of the present invention.

Referring to FIG. 1, a photoresist line or feature 12 may be formed on a semiconductor structure 10, such as a semiconductor substrate. A cap or shell 14 may be formed over the feature 12. Unlike a conventional RELACS cap or shell, the cap 14 in FIG. 1 is anisotropic as opposed to isotropic. That is, the cap 14 extends primarily in the vertical direction and less, if at all, in the horizontal direction. As a result, the thickness of the photoresist feature 12 may be enhanced without unnecessarily increasing the width of the pattern that is transferred as a result of the capped photoresist 12.

Thus, a wide variety of applications may be possible with the structure shown in FIG. 1. For example, etch resistant capping of fragile nanofeatures and increased aspect ratios of resist features may be achieved. This has potential applications for 193 and 157 nanometer lithography to enable the use of less robust photoresists and improving their ability to withstand plasma etching. Another application is in extreme ultraviolet lithography to enable very thin photoresists to be used with low radiation absorption or to enhance aspect ratios. Still another application is in connection with reducing the roughness of extreme ultraviolet photolithography lines. In other lithography processes, thinner resist thicknesses may be utilized, enabling improved ability to pattern the resist. Also, resist patterns that are poorly resolved may be improved by overcoating without unnecessarily increasing the size of the resulting structure in a horizontal direction.

Figure 2:
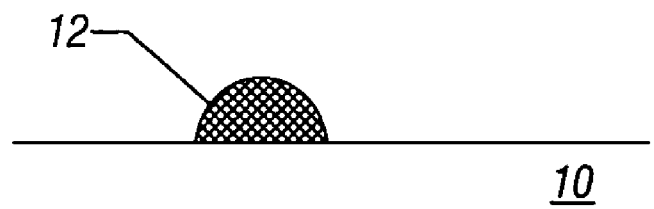
FIG. 2 is an enlarged, cross-sectional view of a photoresist line in accordance with one embodiment of the present invention.
Figure 3:
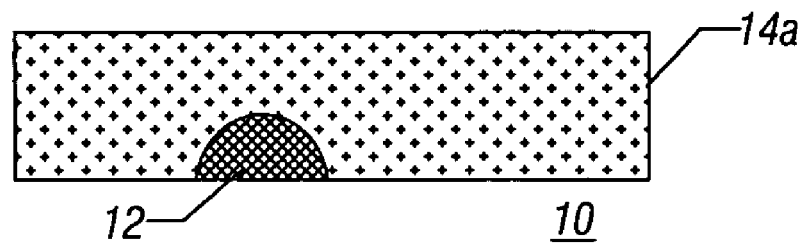
FIG. 3 is an enlarged, cross-sectional view at a subsequent stage of manufacture in accordance with one embodiment of the present invention.

Referring to FIG. 2, a photoresist line or other feature 12 may be defined on a substrate 10 using conventional photolithographic processes. The resulting line 12 may then be covered by a layer 14a as shown in FIG. 3. The layer 14a may be a material which covers the entire substrate 10 in one embodiment. Additionally, the layer 14a is a photoactive material. Examples of photoactive materials include RELACS materials, materials with photoacid generators, and materials with photobase generators, to mention a few examples.

As used herein, "photoactive" refers to a material that has a property that is activated upon exposure to radiation. As used herein, "activated" includes generating another material that acts as a catalyst of a reaction. One such reaction is a cross-linking reaction whereby the material 14a is cross-linked as a result of the release of a catalyst upon exposure to radiation. The catalyst may, for example, be an acid that activates cross-links in a polymer included or formed within the material 14a.

Thus, a photoacid generator or a photobase generator may be intermixed into the formulation comprising the material 14a. A dye may also be incorporated into the formulation comprising the material 14a. The dye may be effective to increase the material 14a's absorption of radiation. As still another example, a quencher may be provided in the formulation comprising the material 14a to control or modulate the kinetics of the cross-linking reaction. The quencher may comprise a base (e.g. tetrabutylammonium hydroxide, 2,6-dimethylpyridene, etc.). The quencher may also be photoactive. As still another example, the material 14a may comprise a dye which bleaches to facilitate additional control over the cross-linking. Another useful additive, in some embodiments, includes suicide bases such as triphenylsulphonium hydroxide. A suicide base enhances the activity of the catalyst or acid in response to radiation exposure. For example, a suicide base may be a sulfur salt that is a base. When irradiated, it may transfer a proton to a base molecule to make it a weak acid, such as water. This acts to modulate the catalysis kinetics of other acidic species present in this irradiated region of the material 14a. As still another example, photoactive dissolution inhibitors or promoters may be added to the base in some embodiments. These materials may start out soluble or insoluble and, when exposed to radiation, before a catalyst works on it, the material may become more or less soluble (i.e. an inversion of solubility characteristics as a function of exposure state). In other words, its solubility is affected by radiation exposure. Examples of such materials include monomeric cholate esters such as t-butylcholate and t-butyldeoxycholate as well as oligomeric and polymeric derivatives thereof.

Figure 4:
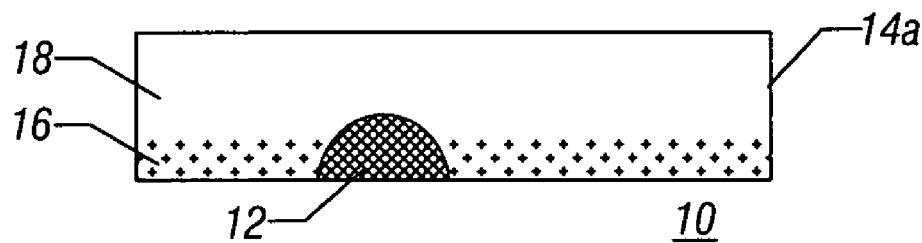
FIG. 4 is an enlarged, cross-sectional view at a subsequent stage of manufacture in accordance with one embodiment of the present invention.

In general, as indicated in FIG. 4, the effect of radiation exposure on the material 14a is to enhance cross-linking over the line or feature 12 relative to cross-linking along the foot or base of the feature 12. This may be achieved by creating a chemical environment over feature 12 that is favorable for reaction initiated by acids or other species contained in feature 12 compared to a chemical environment less favorable for reaction horizontally adjacent to feature 12 (as indicated by shading in the figure). This results in preferential growth in the vertical direction and less or no growth in the horizontal direction. For example, upon radiation exposure, photoacid generators in a material 14a, in one embodiment, may be activated to cross-link the polymer base in the material 14a and to begin to form the partial cap 14b shown in FIG. 5.

In one embodiment, a photon adsorbing additive or moiety (a dye) is incorporated into the design that may be rendered less adsorbing by exposure to radiation (i.e. "photobleaching"). This dye may be a photoacid generator. Thus in such a system, the upper region 18 of the material 14a becomes depleted in active dye, as indicated in FIG. 4, resulting in a bleached structure. The bleaching results in further exposure of the unbleached region 16 down to a desired depth. Only the top of the resist feature 12 is dosed most heavily, activating any remaining photoacid generator therein. Thus, the proton concentration may be higher over the feature 12 and lower along the feature 12 where the photoacid generator (or other photoactive material) is not as significantly impacted by the radiation exposure. This is because the radiation simply cannot get down though the material 14a sufficiently far to activate the material 16 at certain depths.

In another embodiment, a photoactive base, such as a suicide base, may be incorporated into layer 14a. Upon exposure, the suicide base is converted to a weak acid. If the suicide base or an additional dye formulated in layer 14a has significant absorption at the exposure wavelength, the suicide base will be converted to the weak acid, preferentially, in the top portion of layer 14a, as shown in FIG. 4. Alternatively, it the suicide base or an additional dye is photobleaching (as in the previous embodiment), the suicide base will also be converted to the weak acid, preferentially, in the top portion of 14a. In either case, the material above feature 12 will have a lower pH than the areas horizontally adjacent to feature 12, allowing the residual acid in feature 12 (left over from the initial exposure and patterning of the feature) to cause crosslinking or other chemical reaction, preferentially, in the vertical direction while the high pH environment horizontally adjacent to feature 12 quenches the residual acid without significant chemical reaction.

Figure 5:
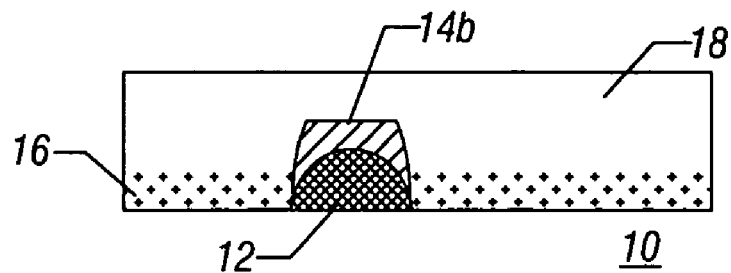
FIG. 5 is an enlarged, cross-sectional view at still a subsequent stage of manufacture in accordance with one embodiment of the present invention.

Referring to FIG. 5, a cross-linked cap 14b begins to grow on top of the feature 12. The transformed region 18 is less activated relative to the cap 14b due to the proximity of the cap 14b to the underlying feature 12 and the unactivated region 16 may not contribute significantly to cap growth. As a result, anisotropic or vertical growth results, as opposed to isotropic growth, which occurs in the RELACS process.

Figure 6:
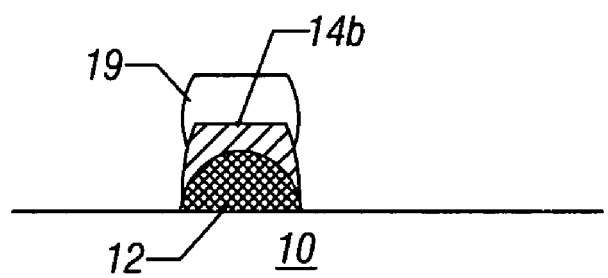
FIG. 6 is an enlarged, cross-sectional view of a capped photoresist line in accordance with one embodiment of the present invention.

Referring to FIG. 6, in one embodiment, the crosslinked material of cap 14b retains residual catalyst similar to the original resist feature 12. Thus, the process may be repeated to add the additional anisotropically grown cap 19 over the previous cap 14b.

Acid quencher, photoactive quencher or other material may be employed to control the reaction kinetics and stability of the formula. Examples of materials that may be utilized as components for the material 14a include bases, dyes, acids, photoacid generators, photobase generators, and materials susceptible to acid and or base catalysed crosslinking reactions (e.g. chemically amplified negative tone photoresist). As particular examples, sulfonate salts, such as triphenylsulphonium-nonafluorobutane sulfonate or bis-2-butylphenyliodonium-nonafluorobutane sulfonate may be used.

Once the process shown in FIG. 5 has run its course, the structure may be rinsed to remove any remaining material 14a to achieve the structure shown in FIG. 1 with a high aspect ratio cap 14. Conventional rinses may be utilized, such as a developer or solvents.

Thus, in some embodiments of the present invention, a photoactive layer may be formed over a resist feature. A shell or cap may be grown over the resist feature preferentially in the vertical direction. In some cases, the horizontal direction growth may be minimal or inconsequential so that the feature size is not significantly increased. At the same time, the ability of the resist to function as a mask may be enhanced.

Figure 7:
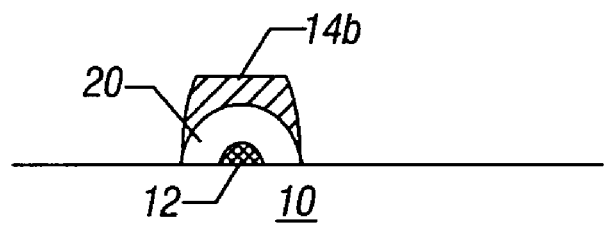
FIG. 7 is an enlarged, cross-sectional view of a capped photoresist line in accordance with one embodiment of the present invention.

Referring to FIG. 7, the photoresist feature 12 may be covered by an isotropic cap 20. The cap 20 may be formed, for example, by the RELACS process. Thereafter, a anisotropically formed cap 14b may be formed over the isotropically formed cap 20. The cap 14b may be formed as described previously herein.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
forming an anisotropic cap over a photoresist feature by forming a first photoactive cap over said photoresist feature that extends vertically and not laterally beyond the edges of said photoresist feature.

2. The method of claim 1 including depositing a photoactive material over said photoresist feature.

3. The method of claim 2 wherein depositing said photoactive material includes exposing said photoactive material to radiation.

4. The method of claim 2 wherein depositing said photoactive material includes depositing a material including a photoacid generator.

5. The method of claim 2 wherein depositing the photoactive material includes depositing a photoactive material including a quencher.

6. The method of claim 2 wherein depositing a photoactive material includes depositing a material including a suicide base.

7. The method of claim 2 wherein depositing a photoactive material includes depositing a material including a solubility inhibitor.

8. The method of claim 2 wherein depositing a photoactive material includes depositing a material including a solubility enhancer.

9. The method of claim 2 wherein depositing a photoactive material includes depositing a photoactive material including a dye.

10. The method of claim 1 including forming a second photoactive cap, over said first photoactive cap, that extends vertically and not laterally beyond the edges of said first cap.

11. The method of claim 1 including isotropically growing a cover over a photoresist feature and then forming the anisotropic cap over said cover.

12. A method comprising:
forming an anisotropic cap over a photoresist feature including isotropically growing a cover over a photoresist feature and then forming an anisotropic cap over said cover.

* * * * *

UNITED STATES PATENT AND TRADEMARK OFFICE
CERTIFICATE OF CORRECTION

PATENT NO.       : 7,615,337 B2  
APPLICATION NO.  : 10/927885  
DATED            : November 10, 2009  
INVENTOR(S)      : Meagley et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1203 days.

Signed and Sealed this

Nineteenth Day of October, 2010

David J. Kappos  
*Director of the United States Patent and Trademark Office*